United States Patent
Ludwig (10) Patent No.: US 8,223,911 B2
(45) Date of Patent: Jul. 17, 2012

(54) SELF-COMPENSATING DRIFT-FREE HIGH-FREQUENCY PHASE DETECTOR CIRCUIT

(75) Inventor: Frank Ludwig, Norderstedt (DE)

(73) Assignee: Deutsches Elektronen-Synchrotron Desy, Hamburg (DE)

( * ) Notice: Subject to any disclaimer, the term of this patent is extended or adjusted under 35 U.S.C. 154(b) by 306 days.

(21) Appl. No.: 12/301,950

(22) PCT Filed: May 21, 2007

(86) PCT No.: PCT/EP2007/004498
§ 371 (c)(1),
(2), (4) Date: Jul. 15, 2010

(87) PCT Pub. No.: WO2007/134826
PCT Pub. Date: Nov. 29, 2007

(65) Prior Publication Data
US 2011/0122977 A1 May 26, 2011

(30) Foreign Application Priority Data
May 23, 2006 (DE) .......................... 10 2006 024 210

(51) Int. Cl.
*H03D 3/24* (2006.01)
(52) U.S. Cl. ........ 375/376; 375/355; 375/360; 375/371; 375/373; 375/374; 375/375
(58) Field of Classification Search .................. 375/346, 375/373, 374, 375, 376; 327/141; 370/503
See application file for complete search history.

(56) References Cited

U.S. PATENT DOCUMENTS

| | | | |
|---|---|---|---|
| 3,761,829 A | 9/1973 | Spaulding | |
| 3,883,755 A | 5/1975 | Faulkner | |
| 4,042,885 A | 8/1977 | Rhodes, Jr. | |
| 4,155,050 A | 5/1979 | Nichols | |
| 4,389,621 A | 6/1983 | Futatsuishi | |
| 4,728,884 A | 3/1988 | Gumm | |
| 4,816,775 A * | 3/1989 | Ryan ............................. | 331/12 |
| 4,937,537 A | 6/1990 | Nyqvist | |
| 4,975,650 A | 12/1990 | Martin | |
| 5,210,509 A | 5/1993 | Greeff et al. | |
| 5,614,861 A | 3/1997 | Harada | |

(Continued)

FOREIGN PATENT DOCUMENTS
EP 0540052 5/1993
(Continued)

*Primary Examiner* — Dhaval Patel
(74) *Attorney, Agent, or Firm* — Hovey Williams LLP (57) ABSTRACT

The present invention relates to a phase detector circuit (10) having an RF distribution device (20) which is intended to receive two sinusoidal high-frequency signals (RF, LO) with an input phase difference ($\phi_{RF}(t)-\phi_{LO}(t)$) and comprises two power splitters (21, 22) in order to split the two high-frequency signals (RF, LO) into two respective parts, a self-calibrating phase detector module (30) which is configured to receive one respective part of the two high-frequency signals which have been split, a low-noise phase detector module (40) which is configured to receive the respective other part of the high-frequency signals which have been split, and a complementary filter device (50) which is configured to receive the output signals from the self-calibrating phase detector module (30) and the low-noise phase detector module (40) and to output a signal which indicates the time-dependent input phase difference between the two high-frequency signals (RF, LO).

22 Claims, 5 Drawing Sheets

U.S. PATENT DOCUMENTS

| | | |
|---|---|---|
| 5,659,263 A | 8/1997 | Dow et al. |
| 5,870,670 A | 2/1999 | Ripley et al. |
| 6,087,897 A | 7/2000 | Wang |
| 6,167,242 A | 12/2000 | Henderson et al. |
| 6,242,974 B1 | 6/2001 | Kunst |
| 6,340,903 B1 | 1/2002 | Leith |
| 6,476,671 B1 | 11/2002 | Tang |
| 6,781,450 B1 | 8/2004 | Mercer et al. |
| 6,937,684 B2 | 8/2005 | Tzou et al. |
| 7,089,444 B1 * | 8/2006 | Asaduzzaman et al. ...... 713/600 |
| 7,095,254 B2 * | 8/2006 | Schrodinger ............ 327/40 |
| 2002/0181619 A1 | 12/2002 | McCune, Jr. |
| 2005/0237120 A1 | 10/2005 | Park |

FOREIGN PATENT DOCUMENTS

| | | |
|---|---|---|
| EP | 1184972 | 3/2002 |
| WO | 9936792 | 7/1999 |
| WO | 0120350 | 3/2001 |

* cited by examiner

SELF-COMPENSATING DRIFT-FREE HIGH-FREQUENCY PHASE DETECTOR CIRCUIT

CROSS-REFERENCE TO RELATED APPLICATIONS

This is a National Phase Application pursuant to 37 C.F.R. §371 of International Application No. PCT/EP2007/004498, filed May 21, 2007, claiming priority from German Application No. DE 10 2006 024 210.6, filed May 23, 2006, the entire disclosures of which are hereby incorporated by reference herein.

BACKGROUND OF THE INVENTION

1. Field of the Invention

The present invention generally relates to a detector system, e.g. for synchronization of an FEL ("Free Electron Laser"), and in particular to a combined, low-noise, self-compensating and nearly drift-free high-frequency phase detector circuit for continuous measurements, and especially to a self-calibrating, nearly drift-free phase detector module which is preferably, but not solely, applied in such a phase detector circuit.

2. Discussion of the Prior Art

The invention is based on the finding that conventional detector systems have a drift in the range of several picoseconds which is substantially caused by the temperature dependency thereof. For many applications, this value is too high and exceeds for instance significantly the value of 10-100 femtoseconds which is considered to be necessary for synchronization of the so-called XFEL ("X-Ray Free-Electron Laser"—a European X-ray laser project where electrons are first accelerated to high energies and then caused to emit high-intensity X-ray laser flashes). As the available low-drift detector systems often show considerable noise, they are unsuitable for the practical application in many cases.

Examples of known detector systems and circuits for minimization of drift and noise are e.g. shown in documents U.S. Pat. No. 3,883,755; U.S. Pat. No. 4,042,885; U.S. Pat. No. 4,155,050; U.S. Pat. No. 4,389,621; U.S. Pat. No. 4,728,884; U.S. Pat. No. 4,937,537; U.S. Pat. No. 5,210,509; U.S. Pat. No. 6,087,897; U.S. Pat. No. 6,167,242; U.S. Pat. No. 6,242,974; U.S. Pat. No. 6,340,903; U.S. Pat. No. 6,476,671; U.S. Pat. No. 6,781,450; U.S. Pat. No. 6,937,684; EP 0 540 052; EP 1 184 972; WO 99/36792; and WO 01/20350, however, none of these documents disclose solutions for the problems mentioned above.

SUMMARY

It is an object of the present invention to provide a high-frequency phase detector circuit having extremely low-noise and substantially drift-free characteristics and also having the characteristics of self-compensation. A further object of the present invention is to provide a self-calibrating, nearly drift-free phase detector module which is preferably used in a high-frequency phase detector circuit.

For the solution of these objects serves a high-frequency phase detector circuit having the features of independent claim 1, and a self-calibrating phase detector module having the features of the independent claim 13. Advantageous embodiments of the invention are defined in the respective dependent claims.

BRIEF DESCRIPTION OF THE DRAWING FIGURES

In the following, the invention will be exemplified on the basis of an exemplary embodiment in the figures, wherein.

DETAILED DESCRIPTION OF THE PREFERRED EMBODIMENTS

For measurement and synchronization of high-frequency signals, phase detector circuits are usually used in PLLs (Phase-Lock-Loop). In particular, phase detector circuits are used in PLLs during synchronization, generation, distribution and verification of different frequencies which are locked to each other.

Figure 1:
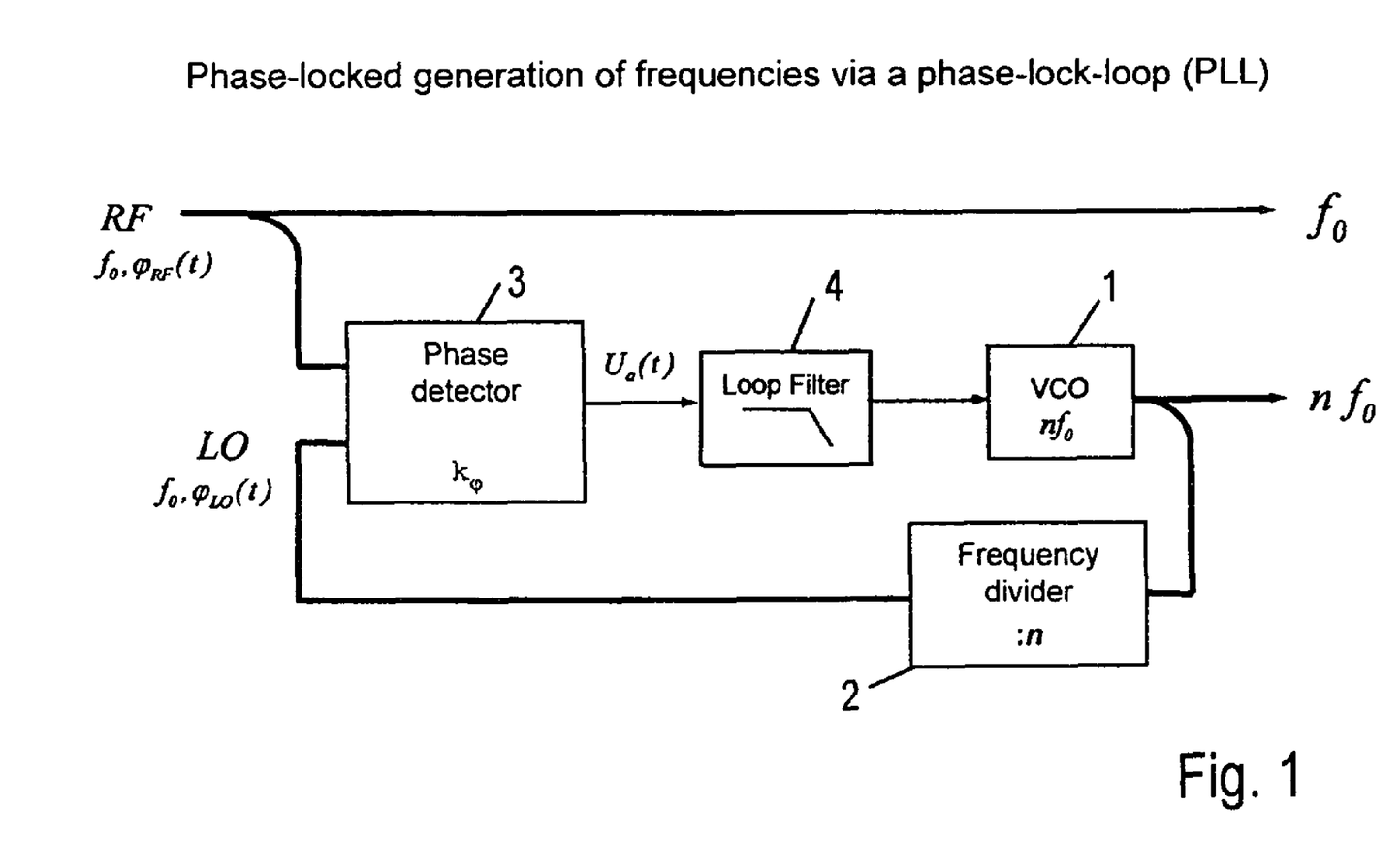
FIG. 1 shows the basic principle for the phase-locked generation of frequencies using a PLL (Phase-Lock-Loop)

FIG. 1 shows the basic principle for the phase-locked generation of frequencies using a PLL. Herein, a VCO 1 (voltage Controlled Oscillator) generates a frequency $nf_0$ multiplied by n, which in turn, divided by n using a frequency divider 2, being compared with the original frequency RF by means of a phase detector 3. Thereafter, the frequency of the VCO 1, and thereby the designated phase, is tuned via a filter 4 (Loop-Filter).

However, during the time-jitter-free distribution and synchronization of signals in the fs-range, minimal phase-noise-differences and drift-differences are essential. Therefore, in particular for monitoring and back-regulation of phase variations, substantially improved phase detectors having a lower drift and a lower noise are needed than known in the state of the art. The currently available phase detector systems do not meet the high requirements with respect to the characteristics of drift and noise as required for the operation of an XFEL (X-Ray-Free-Electron-Laser) accelerator, for example.

Figure 2:
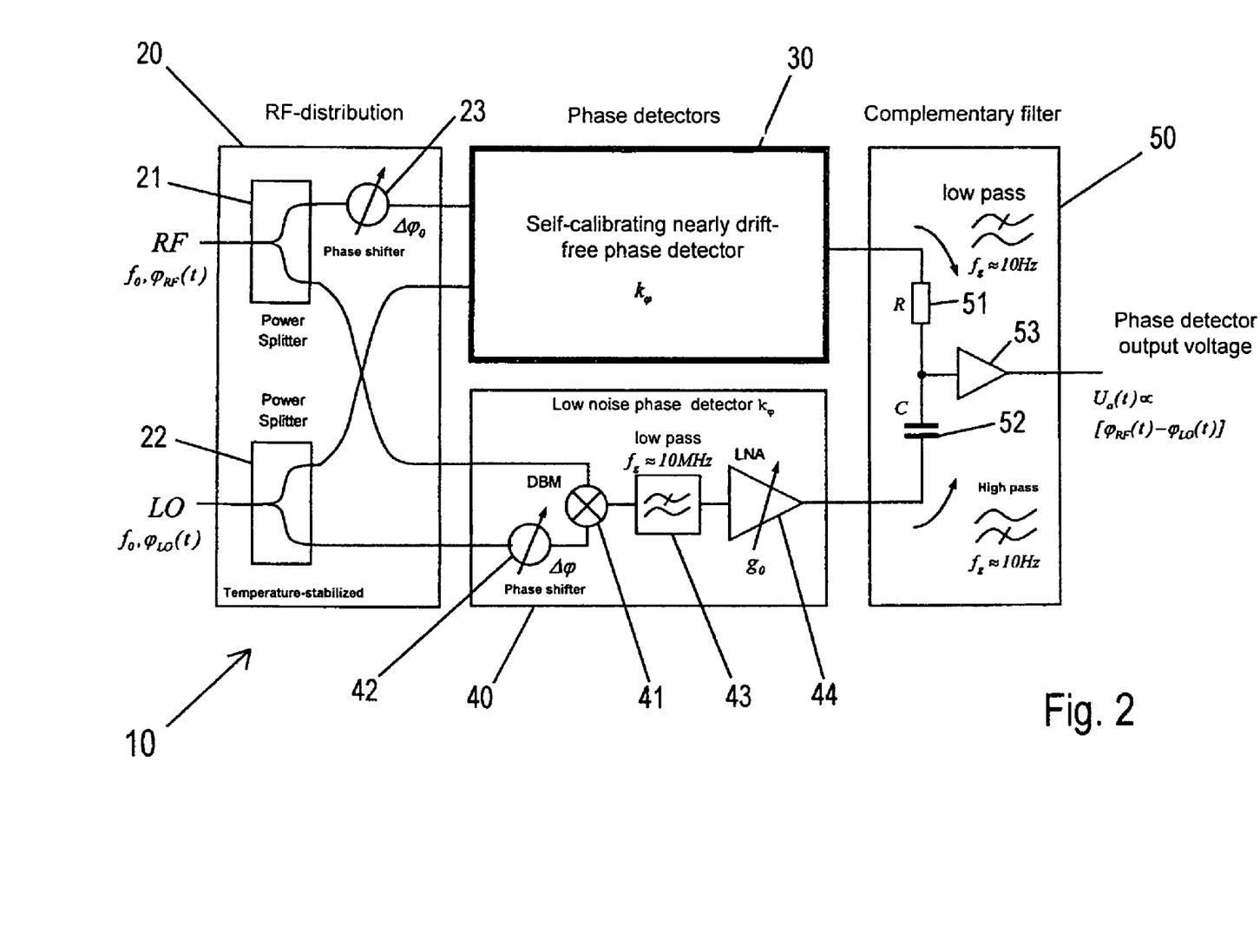
FIG. 2 shows a schematic block diagram of a combined, low-noise, self-compensating, nearly drift-free phase detector circuit for continuous measurements.

Therefore, to meet the requirements regarding drift and noise, according to the present invention and with reference to FIG. 2, a combined, self-compensating, nearly drift-free and low-noise phase detector circuit 10 is provided, which circuit comprises an RF distribution device 20, a self-calibrating (i.e. self-compensating), nearly drift-free phase detector module 30, a low-noise phase detector module 40, and a complementary filter device 50. In principle, the input phase difference to be measured of two sinusoidal high-frequency signals RF, LO having the same frequency $f_0$ in a frequency range of about 1 GHz is each measured nearly drift-free and with low-noise via power splitters 21, 22 and combined in the base band by means of the complementary filter device 50 in order to retrieve the input phase difference. Any phase differences $\Delta\phi_0$, caused for example by runtime differences, can be compensated by a phase shifter 23 or by cable length adjustment. In order to minimize occurring phase-drifts of the power splitters 21, 22 and the cables themselves, the RF distribution device 20 is temperature-stabilized in a known manner. In order that the retrieval of the time-dependent phase difference signals is as accurate to shape and as independent from the temperature-dependent tolerances of the complementary filter 50 as possible, the filter comprises an RC-low pass/high pass of first order having a resistor 51 and a capacitor 52 with automatically given equal cut-off frequencies followed by an impedance converter 53. The cut-off frequency of the complementary filter 50 is typically about 1-100 Hz. Due to the frequency distribution of the complementary filter device 50, the drift characteristics of the low-noise phase detector module 40 and the noise characteristics of the nearly drift-free phase detector module 30 are neglectable.

As can be seen in FIG. 2, the phase detector circuit 10 comprises an RF distribution device 20 having two power splitters 21, 22 and one phase shifter 23, two phase detector modules 30 and 40, and a complementary filter device 50. Each of the power splitters 21 and 22 has one input and two outputs. The frequency signal $RF(f_0)$ is applied to the input of the first power splitter 21, and the frequency signal $LO(f_0)$ is applied to the input of the second power splitter 22. Both frequency signals $RF(f_0)$ and $LO(f_0)$ are split by the respective power splitter 21 and 22 and are each fed to an input of the two phase detector modules 30, 40. The outputs of the two phase detector modules 30, 40 are each fed to the complementary filter device 50, wherein the output of the self-compensating, nearly drift-free phase detector module 30 is applied to the resistor 51, and the output of the low-noise phase detector module 40 is applied to the capacitor 52. The resistor 51 and the capacitor 52 form the high pass/low pass filter followed by an amplifier 53.

For low-noise phase detection, as shown in FIG. 2, a passive diode mixer 41 (DBM=double balanced diode mixer) which is coupled with a manually operated phase shifter 42 ($\Delta\phi$) and which is connected with a low pass filter 43 (cut-off frequency of typically about 10 MHz) is used for the separation of the sum-frequency. The phase difference is output at the output of the low pass filter 42 in the form of a voltage via a low-noise, dc-coupled operational amplifier 44 (LNA) by means of the integrated circuit AD797 (Analog Devices). In order that the retrieval of the phase difference signal is accurate in shape, the gain $g_0$ of the operational amplifier 44 is adjusted in such a way that the phase-to-voltage—conversion coefficients $k_\phi$ of the two phase detector modules (i.e. drift-free phase detector module 30 and low-noise phase detector module 40) are as similar as possible. This is not absolutely necessary for the operation of the phase detector circuit 10 within a PLL as the phase detector circuit 10 is operated with an output $U_a(t)$ around zero.

The use of a mixer in the small-signal mode as the phase detector circuit requires at average the maintenance of a phase difference of 90 degrees between the frequencies to be compared, which is fulfilled by the use of the detector in a PLL including a back-regulation circuit that typically comprises an integrator and a VCO. In this configuration, the combined phase detector serves as a zero-detector, and therefore, any drifts of the phase-to-voltage-conversion coefficients themselves have a neglectable influence, and merely the offset-drifts of the phase detector have to be compensated, which is subject of the following explanations.

Figure 3:
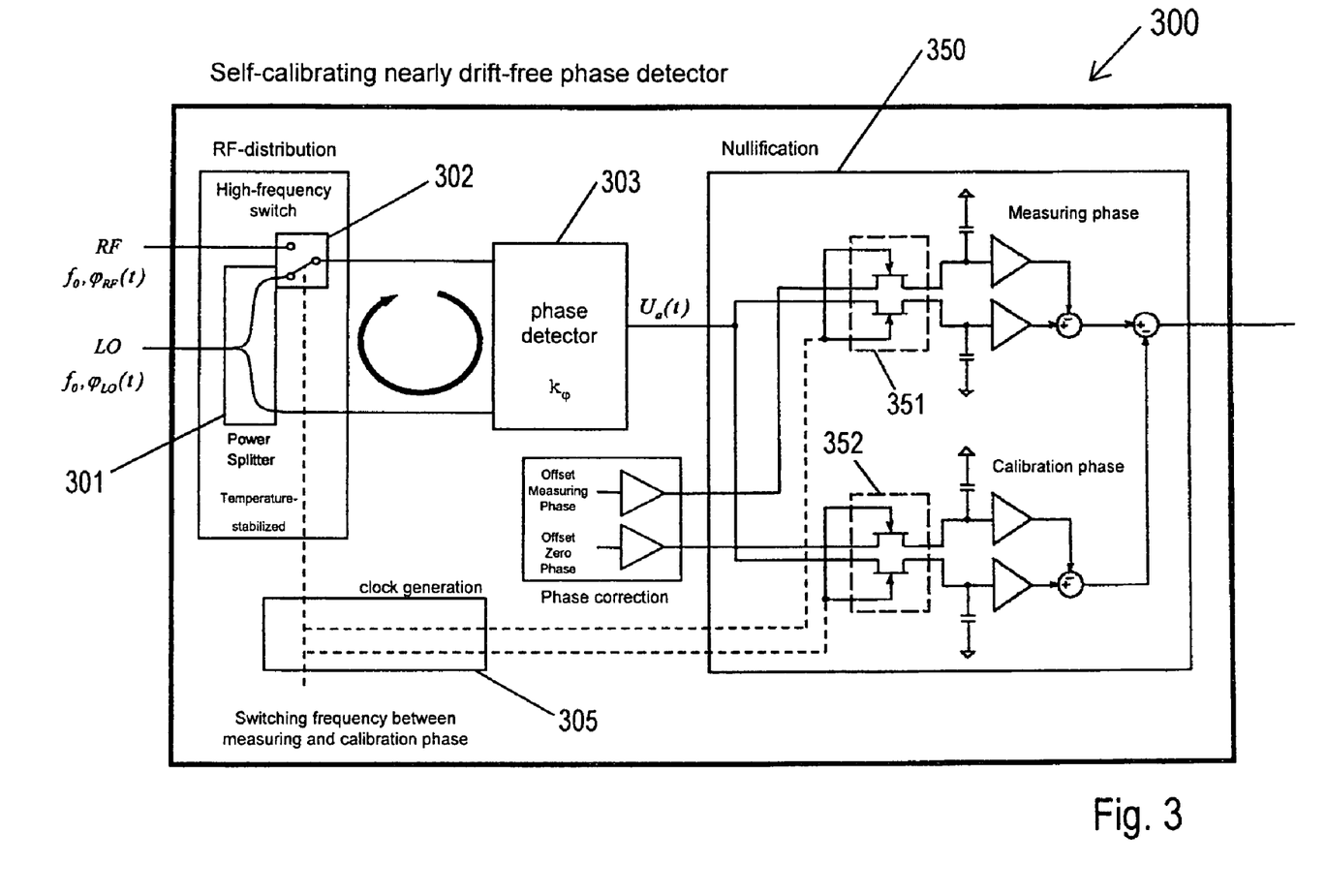
FIG. 3 shows an illustration of a first exemplary embodiment of the self-compensating, nearly drift-free, high-frequency phase detector module of FIG. 2.

Reference is now made to FIG. 3, in which a first exemplary embodiment of the self-calibrating (i.e. self-compensating), nearly drift-free phase detector module 30 of FIG. 2 is shown, which is designated with reference number 300 in FIG. 3. The actual self-compensation of the nearly drift-free phase detector module 300 according to the first exemplary embodiment of the present invention, as shown in FIG. 3, is carried out by means of a power splitter 301 and by the implementation of a nullification 350 at the output of a phase detector 303 during the calibration phase. Thereby, the phase-drifts and the low frequent 1/f-phase noise components of the reference generator delivering the signals RF, LO, of the phase detector 303, of the supply lines, and of the amplifier (not shown) within the calibration circuit are suppressed, as two, in themselves fully correlated signals RF, LO are provided to the phase detector 303 whose phase difference has to be zero. Thus, occurring fluctuations at the output of the phase detector 303 can be buffered during the calibration phase by means of a sample-and-hold stage. Under the assumption that the phase drifts of the phase detector 303, saved during the calibration phase, nearly remained constant during the measuring phase, that the phase difference to be measured behaves additive, and that the high-frequency switch 302 itself delivers only constant phase contributions, the phase difference to be measured can be determined by subtraction of the prior buffered phase drifts of the detector.

As shown in FIG. 3, two frequency signals RF, LO are supplied to the self-calibrating, nearly drift-free phase detector module 300. The frequency signal LO is supplied to the power splitter 301, and the frequency signal RF is supplied to the first input of the high-frequency switch 302. As can further be seen in FIG. 3, a first output signal of the power splitter 301 is supplied to the second input of the high-frequency switch 302. The output of the high-frequency switch 302 is then fed to a first input of the phase detector 303, and a second output signal of the power splitter is fed to the second input of the phase detector 303. The output of the phase detector 303 is then amplified by means of an amplifier stage, and is subjected to nullification 350. The high-frequency switch 302 has an additional control input to which a switching frequency from a clock generation device 305 is applied in order to be able to switch over the position of the high-frequency switch 302 between a measuring phase and a calibration phase. During the calibration phase (position of the high-frequency switch as shown in FIG. 3), the first output of the power splitter 301 is coupled to the first input of the phase detector 303, and the second output of the power splitter 301 is coupled to the second input of the phase detector 303. The fully correlated high-frequency signals generated at the power splitter 301 therefore serve as nullification signals for the detector output during the calibration phase. During the measuring phase, in which the first input of the high-frequency switch 302 to which the frequency signal RF is applied is coupled to the output of the high-frequency switch 302, the phase difference to be measured additionally appears at the output of the phase detector 303 so that the drift-fault-voltage, stored by means of a sample-and-hold-stage during the calibration phase, can be taken into account during the nullification. For an effective suppression of drifts and low-frequent 1/f-noise, the switching frequency should be chosen as high as possible.

In the following, it will be disclosed that the calibration process under usage of two fully correlated signals derived from a reference source is independent from phase noise and drifts of the reference source itself and is therefore very effective. During the measuring phase, the phase detector 303 measures the input phase difference $\phi_{RF}-\phi_{LO}$ of the signals RF and LO by means of the conversion coefficient $k_\phi$ in the form of a voltage $$U_a(t)=k_\phi[\phi_{RF}(t)-\phi_{LO}(t)] \qquad (1)$$

and it described in the frequency space by the spectral density of the voltage noise $S_U(f)$, the phase noise at the inputs $S_{\phi,RF}(f)$, $S_{\phi,LO}(f)$ and its correlation $\gamma_{RF,LO}(f)$ as $$S_U(f) = 2k_\phi^2 S_\phi(f); \quad S_\phi(f) = S_{\phi,RF}(f) + S_{\phi,LO}(f) - 2\gamma_{RF,LO}(f)\sqrt{S_{\phi,RF}(f)}\sqrt{S_{\phi,LO}(f)} \quad (2)$$

During the calibration phase, the signals originating from the reference source are fully correlated and equation (2) comes with $\gamma_{RF,LO}(f)=1$ to $$S_\phi(f) = (\sqrt{S_{\phi,RF}(f)} - \sqrt{S_{\phi,LO}(f)})^2 \quad (3)$$

As the signals at the power splitter 301 being derived from a reference source, it is $S_{\phi,RF}(f) = S_{\phi,LO}(f)$, and with equation (3) it becomes $S_\phi(f)=0$ resp. $S_U(f)=0$ or $U_a(t)=0$. Otherwise, occurring phase noise components or drifts within the calibration loop can therefore be suppressed. For minimization of any occurring phase drifts of the power splitter 301 itself, the RF distribution itself is temperature-stabilized. Runtime differences of cable lengths are fed via phase correction as offsets into the compensation during the measuring phase and the calibration phase, respectively.

For the phase detector 303, a conventional integrated circuit HMC439 (Hittite Microwave Cooperation) with a well-defined phase measuring range of +/−180 degrees is used. In order to effectively suppress the phase drifts of the detector, the switching frequency between measuring phase and calibration phase shall be chosen with about 10 kHz as high as possible. The switching of the high-frequency is carried out with a conventional available integrated circuit HMC349 having rise times in the ns-range and a high isolation. The subtraction itself can be carried out by means of an analog-to-digital converter or by means of two sample-and-hold-stages with subsequent analog difference generation. In order that this process operates as drift-free as possible, thermally coupled duplex JFET's 351, 352 having symmetric drive, supply and holding capacities are used as a switch from which one JFET branch, respectively, is supplied with a constant voltage after imaging without signal. Thereby, after subsequent difference generation, transcharging effects of the holding capacities can be reduced up to the μV-range due to the intrinsic drain-, gate- and source-JFET capacities. In order that the faults of the signal sampling during the nullification at the output can be neglected, the switching frequency generated by the clock generation device 305 which is coupled with the JFET's 351 and 352 is chosen, with about 10 kHz, substantially higher than the cut-off frequency of the complementary filters which is about 1-100 Hz. Additionally, those faults can be neglected for phase differences tending to zero in the PLL-mode.

Figure 4:
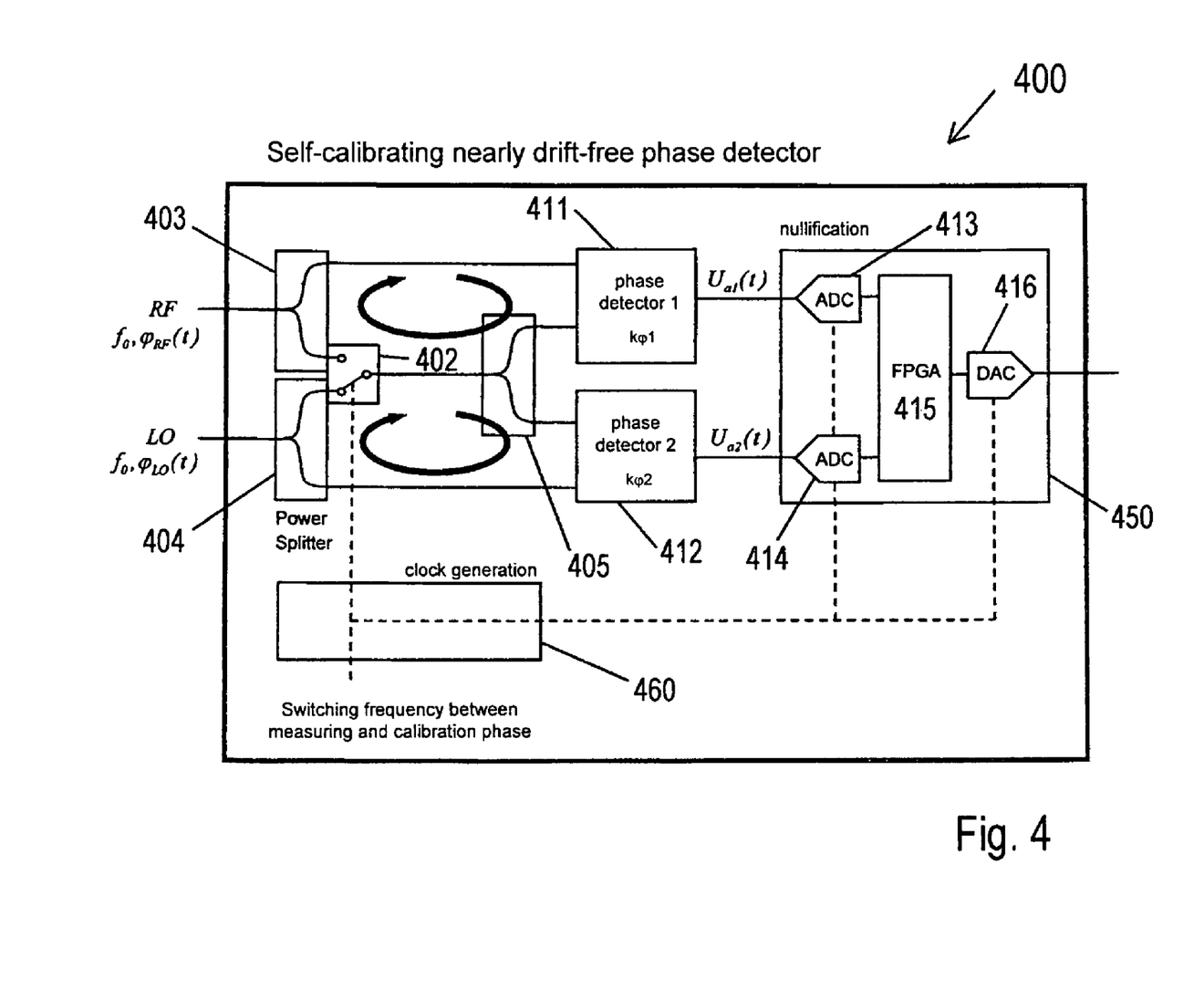
FIG. 4 shows an illustration of a second exemplary embodiment of the self-compensating, nearly drift-free, high-frequency phase detector module of FIG. 2.

FIG. 4 shows a self-calibrating, nearly drift-free phase detector 400 of the circuit of FIG. 2 which is a modification of the phase detector 300 of FIG. 3. With this phase detector 400, occurring drifting is suppressed in both settings of a high-frequency switch 402 (chopper switch). The second phase detector 411 is in the position shown in FIG. 4 of the high-frequency switch in the calibration phase, whereas the first phase detector 412 is in the measuring phase, and vice versa. Alternatively to the nullification of FIG. 3 by means of a sample-and-hold-circuit, the voltage signals can be detected in this second exemplary embodiment during the measuring phase and calibration phase by means of the ADC (Analog/Digital-Converter), set off with an FPGA 415 (Field Programmable Gate Array), and edited by a DAC 416 (Digital/Analog-Converter).

As shown in FIG. 4, two power splitters 403, 404 are provided to whose inputs the frequency signal RF($f_0$) and LO($f_0$), respectively, is applied. The first output of the first power splitter 403 is directly coupled to the first input of the first phase detector 411, and the second output of the second power splitter 404 is directly coupled to the second input of a second phase detector 412. Furthermore, the second output of the first power splitter 403 is coupled to the first input of the high-frequency switch 402, and the first output of the second power splitter 404 is coupled to the second input of the high-frequency switch 402. The output of the high-frequency switch 402 is coupled to the input of an inversely connected third power splitter 405 whose two outputs are coupled to the second input of the first phase detector 411 and with the first input of the second phase detector 412, respectively. The both outputs of the first and the second phase detector 411, 412 are each coupled with the nullification device 450, namely, as described above, with the ADC 413 and with the ADC 414, respectively. From FIG. 4, it is obvious that the second phase detector 412 is in the position of the high-frequency switch 402 in the calibration phase, which is shown in FIG. 4, whereas the first phase detector 411 is in the measuring phase, and vice versa.

The clock generation device 460 acts in a similar manner as described above with reference to FIG. 3.

Figure 5:
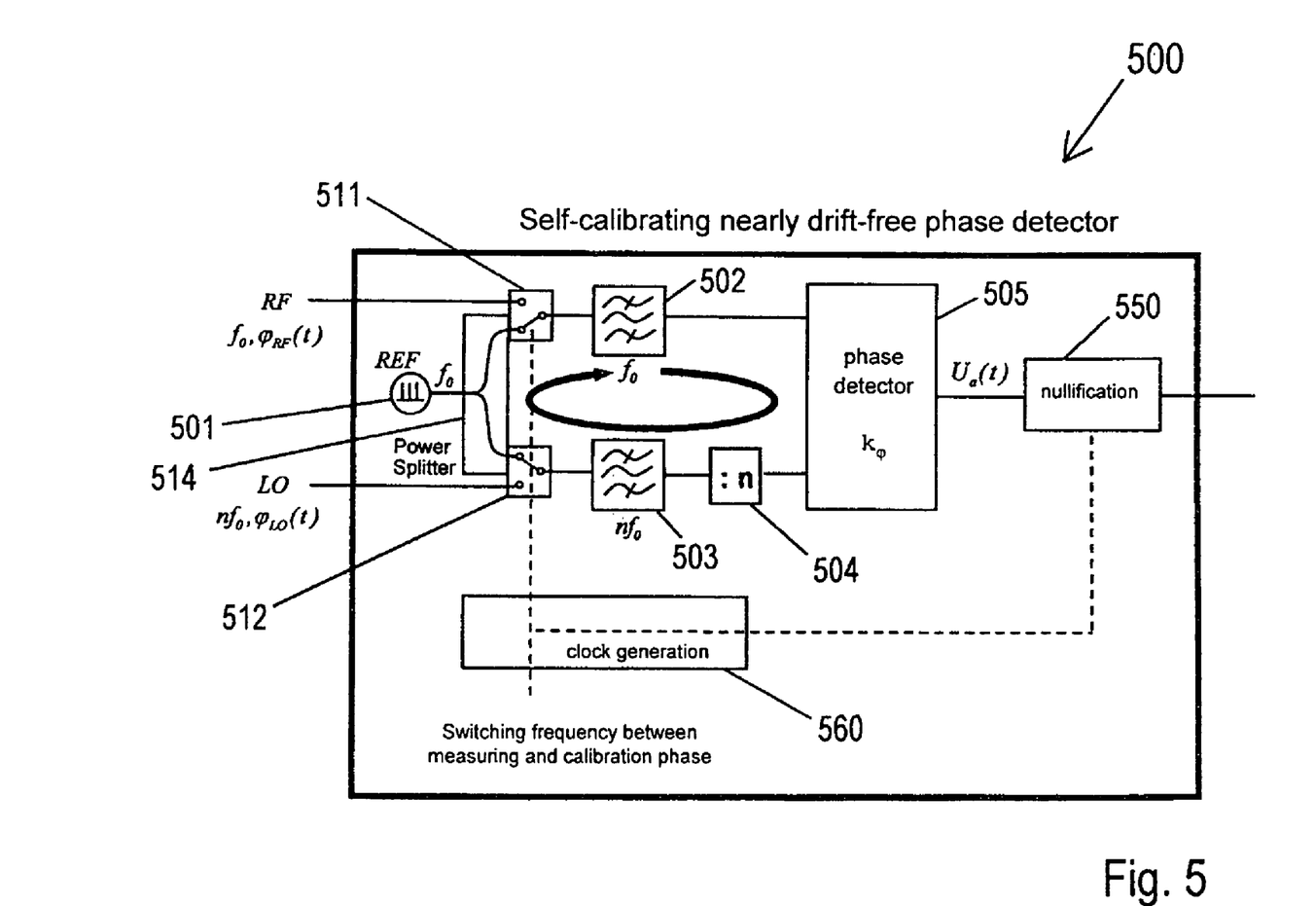
FIG. 5 shows an illustration of a third exemplary embodiment of the self-compensating, nearly drift-free, high-frequency phase detector module of FIG. 2.

In the case of different frequencies to be compared (see FIG. 5), the compensation principle according a further third exemplary embodiment of the present invention can be upgraded in order to suppress also drifts and 1/f-noise of high-frequency splitters. To achieve this, a pulsed reference source 501 is needed which provides phase noise spectra $S_{\phi,RF}^{Ref}(f)$ and $S_{\phi,LO}^{Ref}(f)$, respectively, which are fully correlated to each other, on different frequencies $f_{RF}$ and $f_{LO}$, respectively. With the repetition rate of the pulse sequence $f_0$, it is $$f_{RF} = mf_0 \text{ with } S_{\phi,RF}^{Ref} = m^2 S_{\phi,f_0} \quad (4)$$

$$f_{LO} = nf_0 \text{ with } S_{\phi,LO}^{Ref} = n^2 S_{\phi,f_0} \quad (5)$$

For m=1, equations (4) and (5) reduce to $$\frac{\sqrt{S_{\varphi,RF}^{Ref}(f)}}{S_{\varphi,LO}^{Ref}(f)} = \frac{1}{n} = \frac{f_{RF}}{f_{LO}}, \quad (6)$$

such that the reference signals are provided by means of band pass filtering (band pass filter 502, 503) at the frequencies $f_{RF}$, $f_{LO}=nf_{RF}$ for integer n>1 during the calibration phase. The pulsed reference source 501 can be generated in the GHz-range by means of high-frequency generators or by means of fs-fiber-lasers, whose fs-pulses convert with direct photo-diode detection into high-frequency signals. By means of the characteristics of the n-fold high-frequency splitter 504

$$S_{\varphi,LO}(f) = \frac{1}{n^2} S_{\varphi,LO}^{Ref}(f), \quad (7)$$

equation (6) and $S_{\phi,RF}(f) = S_{\phi,RF}^{Ref}(f)$ put into equation (3), one obtains $S_\phi(f)=0$ and therefore no voltage noise by the reference source 501 at the output of the phase detector during the calibration phase. Otherwise, occurring phase noise or drifts within the calibration loop, in particular from the high-frequency splitter 504, can thus be suppressed. The actual nullification 550 is identical to the second exemplary embodiment shown in FIG. 3.

In particular, the exemplary embodiment of the phase detector module 500 according to the invention shown in FIG.

5, by means of which two different frequencies can be processed, comprises two high-frequency switches 511, 512 wherein the frequency signal RF($f_0$) is applied to the first input of the first high-frequency switch 511, and the frequency signal LO($nf_0$) is applied to the second high-frequency switch 512. Furthermore, a power splitter 514 is provided at whose input the rectangular reference signal REF($f_0$) from the reference source 501 is applied. The first output of the power splitter 514 is connected to the second input of a first high-frequency switch 511, and the second output of the power splitter 514 is connected to the first input of a second high-frequency switch 512. The output of the first high-frequency switch 30 is connected to the input of the first band pass filter 502, and the output of the second high-frequency switch 512 is connected to the input of the second band pass filter 503. The output of the second band pass filter 503 is connected to the high-frequency splitter 504 in order to divide the incoming frequency signal by the factor n. The output of the high-frequency splitter 504 as well as the output of the first band pass filter 502 is connected to the phase detector 505 whose output is connected with the nullification 550. Here as well, the first and the second high-frequency switch 511, 512 are each provided with a control input to which a switching frequency from the clock generation device 560 is each applied in order to switch over both high-frequency switches 511, 512 between the measuring phase and the calibration phase. The advantage of this embodiment consists in the fact that, for a rectangular reference signal, the high-frequency signals generated at the power splitter 514 are fully phase correlated for all their harmonics, in particular for the first and second harmonic, and serve thereby as a nullification signal for the output of the phase detector module so that additionally also the drifting of upstream high-frequency parts can be considered.

The method can also be used for drift-free continuous amplitude measurement of high-frequency signals. For this, based on the exemplary embodiment of FIG. 3, one power splitter is relinquished, and the high-frequency switch is connected to zero in order to provide a defined amplitude having the height zero during the calibration phase. Of course, in this exemplary embodiment, all phase detectors have to be replaced by amplitude detectors which is achieved in the case of the low-noise measuring branch of FIG. 2 by compliance with a 0-degree condition by means of the phase shifter $\Delta\phi$.

The invention claimed is:

1. A phase detector circuit comprising:
   an RF distribution device adapted to receive first and second sinusoidal high-frequency signals having an input phase difference therebetween, and including first and second power splitters to split the high-frequency signals into first and second respective parts;
   a self-calibrating phase detector module configured to receive the respective first part of the high-frequency signals which have been split;
   a low-noise phase detector module configured to receive the respective second part of the high-frequency signals which have been split; and
   a complementary filter device configured to receive output signals from the self-calibrating phase detector module and the low-noise phase detector module and to output a signal which indicates the time-dependent input phase difference between the first and second high-frequency signals.

2. The phase detector circuit as claimed in claim 1,
said first high-frequency signal having a frequency of about 1 GHz and said second high-frequency signal having a frequency which is equal to the n-fold frequency of the first high-frequency signal, wherein $n \geq 1$ is an integer.

3. The phase detector circuit as claimed in claim 1,
said complementary filter device including a resistor and a capacitor connected in series in order to form an RC low pass/high pass of first order which is connected to the self-calibrating phase detector module and to the low-noise phase detector module, wherein the time-dependent input phase difference between the first and second high-frequency signals is applied at the output of the RC low pass/high pass.

4. The phase detector circuit as claimed in claim 3,
said RC low pass/high pass of first order being coupled to an impedance converter.

5. The phase detector as claimed in claim 1,
said complementary filter device having a cut-off frequency that is about 1-100 Hz.

6. The phase detector circuit as claimed in claim 1,
said RF distribution device including a phase shifter in order to compensate phase differences caused by runtime differences.

7. The phase detector circuit as claimed in claim 1,
said RF distribution device being temperature-stabilized in order to minimize phase drifts of the power splitters and of cables.

8. The phase detector circuit as claimed in claim 1,
wherein each of the power splitters includes one input and two outputs,
wherein the first high-frequency signal is applied to the input of said first power splitter and the second high-frequency signal is applied to the input of said second power splitter,
wherein the first and second high-frequency signals are each split by the respective power splitter and being each fed to an input of the phase detector modules.

9. The phase detector circuit as claimed in claim 1,
said low-noise phase detector module including a passive diode mixer coupled to a manually operated phase shifter and connected to a low pass filter.

10. The phase detector circuit as claimed in claim 9,
said low pass filter being coupled to a low-noise, dc-coupled operational amplifier,
said phase difference is being applied to an output of the low-noise, dc-coupled operational amplifier in the form of a voltage.

11. The phase detector circuit as claimed in claim 9,
said low pass filter having a cut-off frequency of about 10 MHZ.

12. The phase detector circuit as claimed in claim 10,
said operational amplifier having a gain that is adjusted such that phase-to-voltage-conversion coefficients of each of the phase detector modules are approximately the same.

13. A self-calibrating phase detector module comprising:
   at least one power splitter configured to receive first and second sinusoidal high-frequency signals having an input phase difference therebetween;
   at least one phase detector coupled to the at least one power splitter;
   a nullification device coupled to the at least one phase detector; and
   at least one high-frequency switch connected to the at least one power splitter and to the at least one phase detector,
   said at least one high-frequency switch being activatable to switch over between the at least one power splitter and the at least one phase detector between a measuring phase and a calibration phase in order to cause a self-calibration.

14. The self-calibrating phase detector module as claimed in claim 13; further comprising
a clock generation device to generate a clock signal for controlling the at least one high-frequency switch in order to switch over between the measuring phase and the calibration phase.

15. The self-calibrating phase detector module as claimed in claim 13,
said at least one high-frequency switch being connected during the calibration phase in such a way that fully correlated high-frequency signals of one of the sinusoidal high-frequency signals or of a reference signal are provided at inputs of the at least one phase detector whose phase difference is zero and which serve during the calibration phase as nullification signals for the detector output.

16. The self-calibrating phase detector module as claimed in claim 14,
said clock generation device being coupled to the nullification device in order to control the nullification device with the same clock frequency as the at least one high-frequency switch.

17. The self-calibrating phase detector module as claimed in claim 13;
a power splitter having an input coupled to one of said sinusoidal high-frequency signals; and
a high-frequency switch having two inputs and one output,
wherein the other of the sinusoidal high-frequency signals is coupled to one input of said high-frequency switch,
wherein one output of the power splitter is coupled to the other input of the high-frequency switch,
wherein the other output of the power splitter and the output of the high-frequency switch are coupled to the inputs of the phase detector.

18. The self-calibrating phase detector module as claimed in claim 13;
first and second power splitters each having inputs coupled to the sinusoidal high-frequency signals;
a high-frequency switch having two inputs and one output,
wherein a respective one of the outputs of the power splitters is coupled to a respective one of the two inputs of the high-frequency switch,
wherein the respective other output of the power splitters is coupled to a respective input of a respective one of the phase detectors; and
an inversely connected power splitter having an input coupled to the output of the high-frequency switch and having two outputs each coupled to one of the other inputs of the phase detectors.

19. The self-calibrating phase detector module as claimed in claim 13;
a power splitter having one input and two outputs,
wherein the input of the power splitter is coupled to a pulsed reference signal source for providing phase correlated signals on different frequencies; and
first and second high-frequency switches, each having two inputs and one output,
wherein a respective one of the two inputs of the high-frequency switches is coupled to one of the sinusoidal high-frequency signals,
wherein the respective other input of the high-frequency switches is coupled to a respective output of the power splitter,
wherein the output of the respective high-frequency switches is each coupled to one of two inputs of the phase detector.

20. The self-calibrating phase detector module as claimed in claim 19; and
a band pass filter provided between the output of each of the high-frequency switches and the respective inputs of the phase detector.

21. The self-calibrating phase detector module as claimed in claim 19,
said first high-frequency signal having a frequency of about 1 GHz and said second high-frequency signal having a frequency which is equal to the n-fold frequency of the first high-frequency signal, wherein $n \geq 1$ is an integer.

22. The self-calibrating phase detector module as claimed in claim 20; and
a high-frequency divider provided between the output of the high-frequency switch to which the second sinusoidal high-frequency signal is applied whose frequency is equal to the n-fold frequency of the first sinusoidal high-frequency signal and the respective input of the phase detector to divide the incoming frequency by the factor n.

* * * * *